United States Patent [19]

Cava

[11] Patent Number: 5,413,755
[45] Date of Patent: May 9, 1995

[54] ARTICLE COMPRISING AN INTERMETALLIC SUPERCONDUCTING MATERIAL

[75] Inventor: Robert J. Cava, Bridgewater, N.J.

[73] Assignee: AT&T Corp., Murray Hill, N.J.

[21] Appl. No.: 143,419

[22] Filed: Oct. 26, 1993

[51] Int. Cl.⁶ .................. C22C 5/04; C22C 28/00
[52] U.S. Cl. ................... 420/416; 420/463; 420/901; 505/805
[58] Field of Search .............. 420/416, 463, 901; 505/805

[56] References Cited

U.S. PATENT DOCUMENTS 4,264,358  4/1981  Johnson et al. .................. 420/901

FOREIGN PATENT DOCUMENTS 2043492  3/1972  Germany .................. 420/463
2087139  5/1982  United Kingdom .................. 420/463

OTHER PUBLICATIONS

Doyle, M. L., et al., "Palladium–Rare Earth Alloys", *Platinum Metals Review*, vol. 32, No. 3, 1988, pp. 130–140.

"Superconductivity at 12 K IN Y–Ni–B System", by C. Mazumdar et al., *Solid State Communications*, vol. 87, No. 5, pp. 413–416, 1993.

*Primary Examiner*—George Wyszomierski
*Attorney, Agent, or Firm*—Eugen E. Pacher

[57] ABSTRACT

A novel intermetallic superconductor with surprisingly high transition temperature is disclosed. Exemplary of the novel superconductor is material of overall composition $Y_{1.5}Pd_{4.5}B_4$. A bulk sample of that composition has $T_c$(onset) of 22.6K, with about 0.5 volume % of the sample being superconducting.

1 Claim, 1 Drawing Sheet

ARTICLE COMPRISING AN INTERMETALLIC SUPERCONDUCTING MATERIAL

FIELD OF THE INVENTION

This application pertains to superconducting compositions, more specifically, to intermetallic superconducting compositions.

BACKGROUND OF THE INVENTION

Before the recent discovery of copper-oxide based superconductors, the materials with the highest superconducting critical temperatures ($T_c$) were Niobium- and Vanadium-based intermetallic compounds with the "A15" structure type. These are based on stoichiometry $A_3B$, with the earliest examples $V_3Si(T_c=17K)$ and $Nb_3Sn(T_c=18K)$ discovered in 1953. $T_c$'s in the vicinity of 20K are obtained for Nb-based materials only, with the record high $T_c$ of 23K for $Nb_3Ge$ obtainable in sputtered thin films only, not in bulk material. The highest known bulk $T_c$ is 20.7K for $Nb_3Ga$. The existence of these and many other Nb-based superconductors with lower $T_c$'s have led to the general belief that intermetallic superconductors should include Nb in the chemical system for the best results.

The superconducting magnets currently in wide use in machines such as MRI scanners employ Nb based alloy wire, but preparation of bulk materials with very high $T_c$'s in the A15 structure type has proven difficult. In view of this difficulty, alternative intermetallic superconducting materials with high $T_c$'s would be of considerable interest. Although the $T_c$'s of such intermetallic superconductors might be expected to be lower than those of the copper oxide based ceramic superconductors, the better processability and manufacturability of metals, along with the likelihood of good superconducting critical currents suggests possible advantages over ceramic materials for use at low temperatures.

Although the $T_c$'s of prior an boride superconductors are low, less than 10K, it has been widely speculated that the low mass of boron might result in the presence of high frequency lattice vibrations, and consequently the possibility for relatively high $T_c$'s. Recently, indications of superconductivity were discovered in a Y-Ni-boride composition. See C. Mazumdar et al., *Solid State Communications*, Vol. 87(5), pp. 413-416. The newly discovered Y-Ni-boride, an intermetallic composition, was formed by melting Y, Ni and B in nominal 1:4:1 atomic ratio in an arc furnace, and had $T_c$ (onset) of about 12K.

In view of the great significance of intermetallic superconducting compositions, a new such composition would be of great interest, both scientifically and technologically. This application discloses such a composition.

GLOSSARY AND DEFINITIONS

An "intermetallic" composition is a composition of matter consisting essentially only of (two or more) metallic elements.

Associated with a sample of superconductor material typically are several "transition temperatures" $T_c$. Among them are $T_c$ (onset) and $T_c$ (R=0). The former is the highest temperature at which an indication of superconductivity is observable, and the latter is the highest temperature at which the DC electrical resistance of the sample is essentially zero, to within experimental accuracy. $T_c$ (onset) applies to all appropriate experimental techniques, e.g., resistivity measurements or magnetic measurements.

THE INVENTION

I have discovered a new intermetallic superconductor having a surprisingly high transition temperature, exemplarily 22.6K in a bulk sample, higher than that of bulk $Nb_3Ge$, indeed, higher than that of any other bulk intermetallic composition.

The invention is embodied in an article that comprises a quantity of material that exhibits superconductivity. The material is an intermetallic material that comprises Y, Pd and B, with the chemical composition of the material selected such that the material has a critical temperature $T_c$ (onset) of 20K or higher.

Exemplary of the new superconductor is material of overall composition $Y_{1.5}Pd_{4.5}B_4$, which was found to have $T_c$ (onset) of 22.6K. The magnitude of the diamagnetic response of a sample was indicative of the presence of about 0.5 volume % of superconducting material in a non-superconducting matrix.

Figure 1:
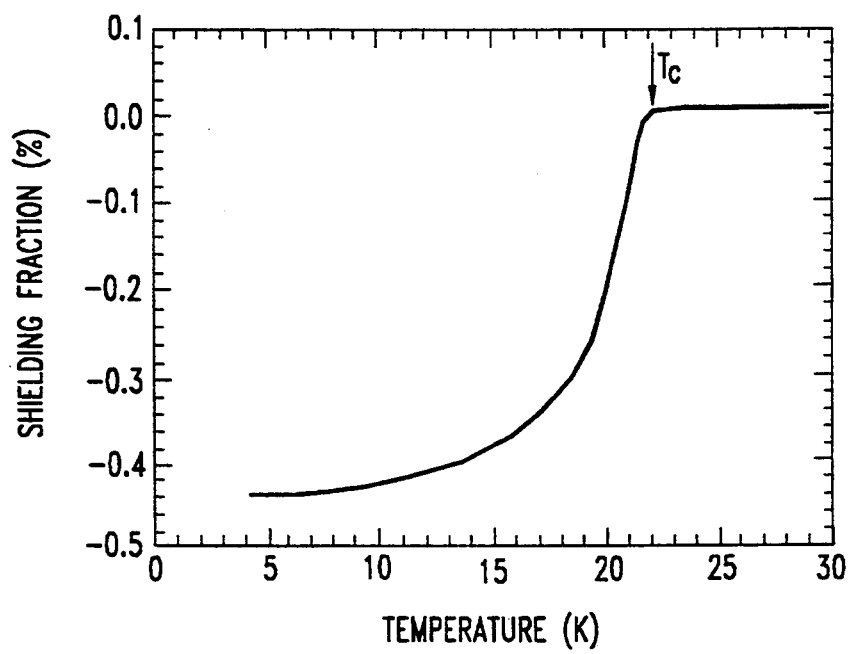
FIG. 1 shows AC susceptibility vs. temperature of an exemplary composition according to the invention.

Exemplarily, the new superconducting composition was prepared by mixing elemental Y, Pd and B (purity at least 99.9%) in the desired atomic ratio, e.g., 1.5:4.5:4. The starting materials were in the form of coarse powders, small chunks or metal shavings. The mixture, exemplarily 1 gram weight, was pressed into a small pellet by conventional means. The pellet was arc melted in a commercially available apparatus (Centorr Furnaces, Nashua, N.H.) under an Ar atmosphere. After solidification and cooling, the resulting button was turned over and melted again under substantially the same conditions. This melting process was repeated once, but can be repeated more often to ensure sample homogeneity. After completion of the process of making the intermetallic sample, a portion of the sample was tested by conventional means (ac susceptibility, Lakeshore Model 7000 Susceptometer). FIG. 1 shows exemplary results, obtained on 0.3188 g of material of nominal composition $Y_{1.5}Pd_{4.5}B_4$, prepared as described above. The data shows that the exemplary material has $T_c$ (onset) of 22.6K, with about half of one percent of the total material being superconducting.

The above described preparatory conditions are exemplary only, and other approaches (e.g., sintering of fine powders) are possible. Indeed, optimization of preparatory conditions can be expected to result in material containing higher percentages of the superconductor.

Figure 2:
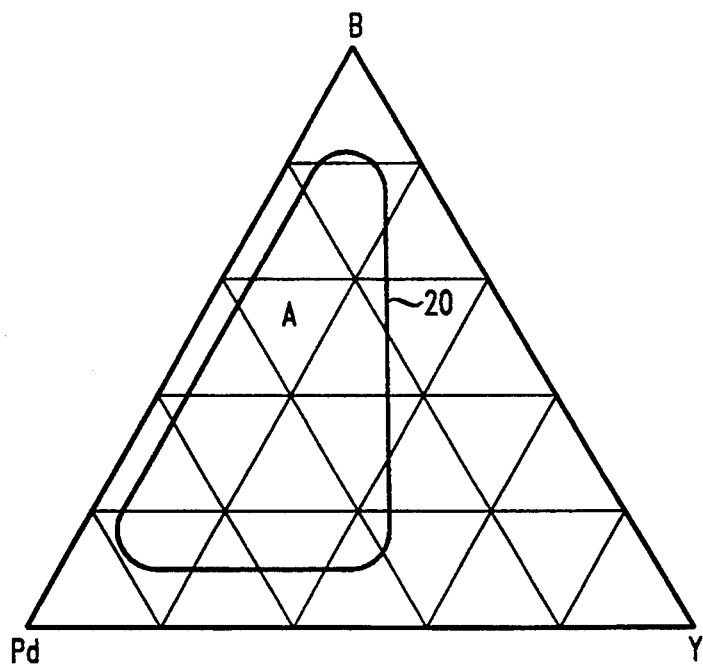
FIG. 2 indicates currently preferred compositions in the Y-Pd-B compositional space.

The disclosed Y:Pd:B atomic ratio (1.5:4.5:4) is exemplary only. FIG. 2 shows the compositional space of the Y-Pd-B system in conventional form. The region of the compositional phase that, according to my present understanding, contains the preferred compositions according to the invention is region A, enclosed by line 20.

I claim:

1. An article comprising a quantity of material that exhibits superconductivity and has a transition temperature $T_c$ (onset); wherein the material is an intermetallic material consisting essentially of Y, Pd and B, with the amounts of Y, Pd and B selected to lie within region A of the Y-Pd-B compositional space, enclosed by line 20 of FIG. 2 of the accompanying drawings, and the material has $T_c$ (onset) of 20K or higher.

* * * * *